United States Patent [19]

Kikuchi

[11] 4,122,539
[45] Oct. 24, 1978

[54] MAGNETIC BUBBLE ELEMENT

[75] Inventor: Yoshiki Kikuchi, Tokyo, Japan

[73] Assignee: Xerox Corporation, Stamford, Conn.

[21] Appl. No.: 786,929

[22] Filed: Apr. 12, 1977

[51] Int. Cl.² ............................................. G11C 19/08
[52] U.S. Cl. ....................................... 365/42; 365/19
[58] Field of Search .................. 340/174 TF; 365/19, 365/20, 42

[56] References Cited

U.S. PATENT DOCUMENTS 3,540,021  11/1970  Bobeck et al. ................ 340/174 TF

OTHER PUBLICATIONS

"Single Phase Cylindrical Magnetic Domain Shift Register"-Keete et al.; IBM Tech. Dis. Bul., vol. 13, #11, Apr. 1971.

Primary Examiner—Vincent P. Canney
Attorney, Agent, or Firm—James J. Ralabate; Sheldon F. Raizes; Irving Keschner

[57] ABSTRACT

A magnetic bubble element which is useful as an image information processing element. A thin film made of a magnetic bubble forming material has a plurality of wedge-formed patterns made of a non-magnetostriction soft magnetic thin film is formed on the upper surface of the thin film 16. A conductor grating comprising two undulating conductor patterns are provided each cycle of the undulation in both conductor patterns defining a wider pitch and a narrower pitch, each of the wedge-formed patterns being disposed over the corresponding part of one of the two conductor patterns defining the narrower pitch in a manner such that the apex portion and the bottom portion of each wedge shaped pattern extend into the parts forming the wider pitch.

9 Claims, 7 Drawing Figures

MAGNETIC BUBBLE ELEMENT

BACKGROUND OF THE INVENTION

A bias modulation method utilizing a magneto-static interaction between a wedge-formed pattern made of a non-magnetostrictive soft magnetic material such as Permalloy and magnetic bubbles (cylindrical domains or localized highly stable magnetic states) and operable for conveying magnetic bubbles toward a desired direction is disclosed the article Application of Orthoferrites to Domain Wall Devices by A. H. Bobeck et al in IEEE Trans. on Mag, MAG-5 (1969) PP. 544–553.

In this method, a series of wedge-formed patterns made of a non-magnetostrictive high premeability thin film are continuously disposed on a thin plate made of a magnetic bubble forming material such as an orthoferrite and the expansion and contraction of the magnetic bubbles due to the variation of a biasing magnetic field are converted into an effective unidirectional movement of the magnetic bubbles.

This method involves a disadvantage in that the wedge-formed patterns are made of a optically opaque material (permalloy) which disturbs the observation of the magnetic bubbles when the latter are used as image forming elements.

SUMMARY OF THE PRESENT INVENTION

The present invention provides a magnetic bubble element which is useful as an image information processing element. A thin film made of a magnetic bubble forming material has a plurality of wedge-formed patterns made of a non-magnetostrictive soft magnetic thin film formed on the upper surface of the thin film 16. A conductor grating comprising two undulating conductor patterns each cycle of the undulation in both conductor patterns defining a wider pitch and a narrower pitch are provided each of the wedge-formed patterns being disposed over the corresponding part of one of the two conductor patterns defining the narrower pitch in a manner such that the apex portion and the bottom portion of each wedge-shaped pattern enter into the parts forming the wider pitch.

It is an object of the present invention to provide a magnetic bubble element which is configured to be particularly useful in image processing applications.

It is a further object of the present invention to provide a magnetic bubble element which includes wedge-formed elements made of optically opaque material for displacing the magnetic bubbles in a desired direction, the bubble element being so fabricated that the movement of the bubbles may be observed making the bubble element suitable for image processing applications.

DESCRIPTION OF THE DRAWINGS

For a better understanding of the invention as well as other objects and further features thereof, reference is made to the following description which is to be read in conjunction with the following drawings wherein.

DESCRIPTION OF THE PREFERRED EMBODIMENTS

Figure 1:
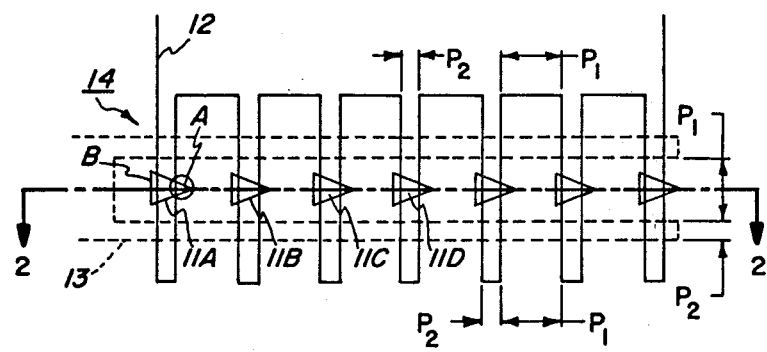
FIG. 1 illustrates the basic configuration of the magnetic bubble element of the present invention.

Referring to FIG. 1, there is indicated an arrangement of a magnetic bubble element which comprises a series of wedge-formed patterns 11A, 11B, 11C, . . . made in a thin film of, for instance, nickel ferrite (permalloy) constituting a mixture of soft magnetic materials exhibiting no magnetostriction, and a conductor grating 14 made of first and second conductor patterns 12 and 13. Each of the conductor patterns 12 and 13 is made of an electric conductor formed into a rectangular undulation, one cycle of which defines a wider pitch $P_1$ and a narrower pitch $P_2$. Each of the wedge-formed patterns 11A, 11B, 11C . . . underlies a pair of conductor runs defining therebetween the narrower pitch $P_2$ in the first conductor pattern 12 in a manner such that the apex portion A and the bottom portion B of each wedge-formed pattern intrude respectively into the parts adjacent thereto forming the wider pitch $P_1$. The second conductor pattern 13 is disposed to form a grating with the first conductor pattern 12 through the interposition of an insulating layer 15 in the embodiment shown in FIG. 2, or patterns 12 and 13 are arranged on the upper and lower surfaces of the magnetic-bubble forming thin film 16, such as the orthoferrites described in the aforementioned Bobeck et al article, to form the grating as shown in FIG. 3. In either of the embodiments shown in FIGS. 2 or 3; the patterns 13 are placed at positions which never intersect with the patterns 11.

The dimensions of the first and second conductor patterns 12 and 13 in one example of this invention are selected in such a manner that when the diameter of the magnetic bubble utilized in this example is assumed to be D, the undulation cycle of the conductor pattern 13 is equal to 4D, the wider pitch $P_1$ defined between the center lines of respective conductor runs is equal to 3 D, the narrower pitch $P_2$ likewise defined is equal to 1 D, and the width of the conductors is equal to D/2.

However, it should be noted that the first and the second conductor patterns are not necessarily limited to be of the same measurements.

Figure 2:
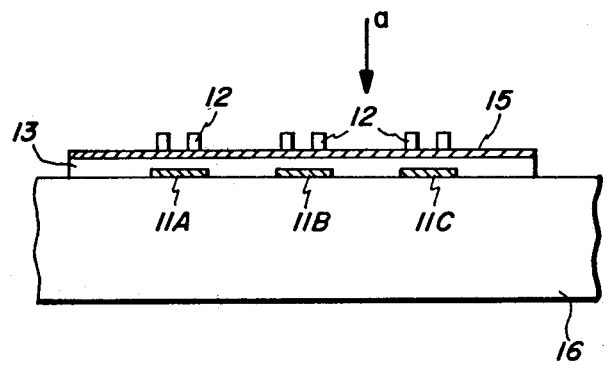
FIGS. 2 and 3 are sectional views along line 2—2 of FIG. 1 showing different embodiments of the present invention.
Figure 3:
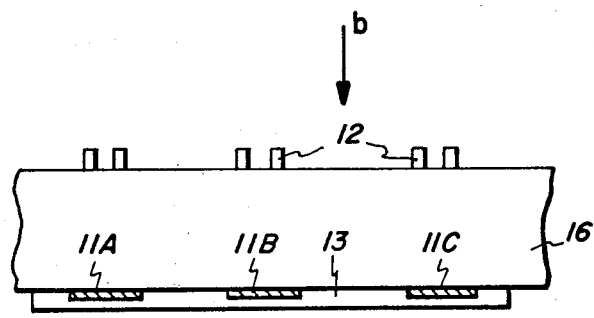

In FIG. 2 which is a sectional view along the line 2—2 in FIG. 1, there is shown the wedge-formed patterns 11 at positions closest adjacent to the magnetic bubble forming thin film 16. The second conductor pattern 13 which does not traverse the wedge-formed patterns 11 and the first conductor pattern 12 which traverses the wedge-formed patterns 11 are provided to overlie the same patterns 11 so that an insulating layer 15 is interposed between the first and second conductor patterns 12 and 13. In FIG. 3, the patterns 12 and 13 are arranged on the upper and lower surfaces respectively of film 16, insulating layer 15 not being required.

Figure 4:
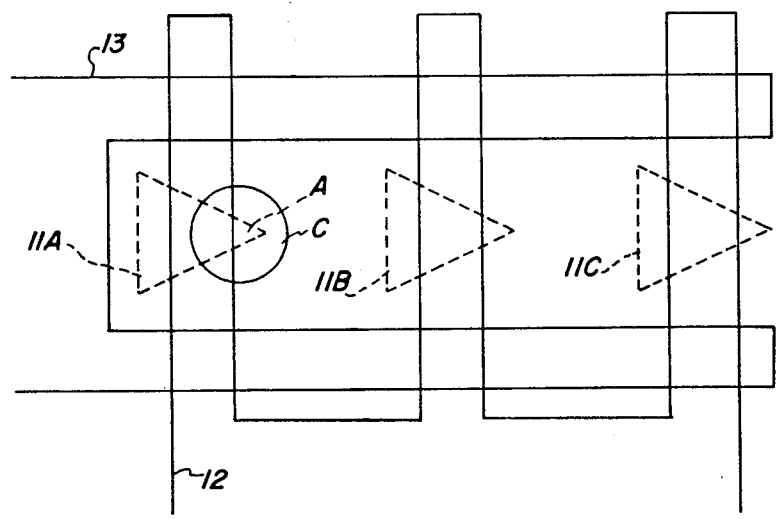
FIGS. 4–6 schematically illustrate the magnetizing state of the magnetic bubbles as the bubble is caused to move.
Figure 5:
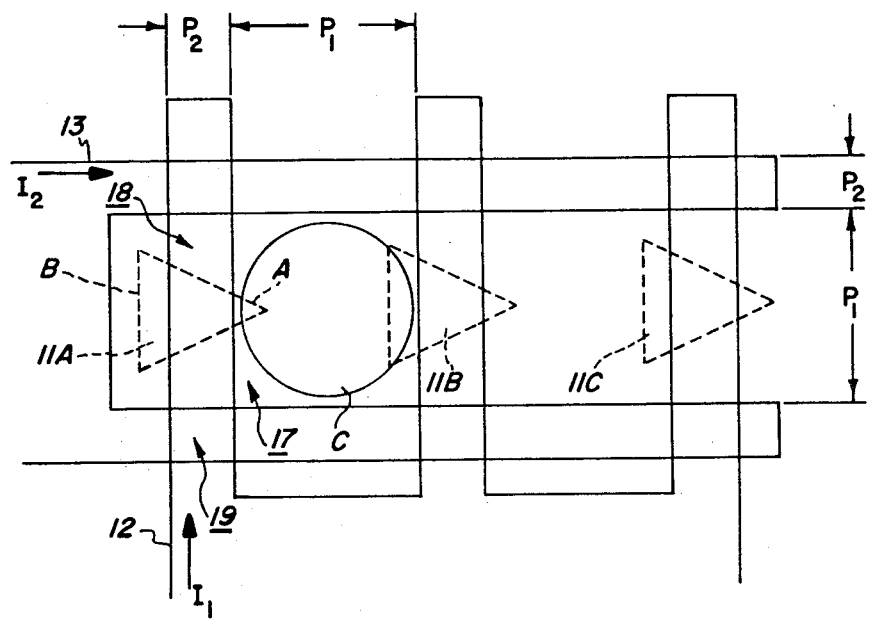
Figure 6:
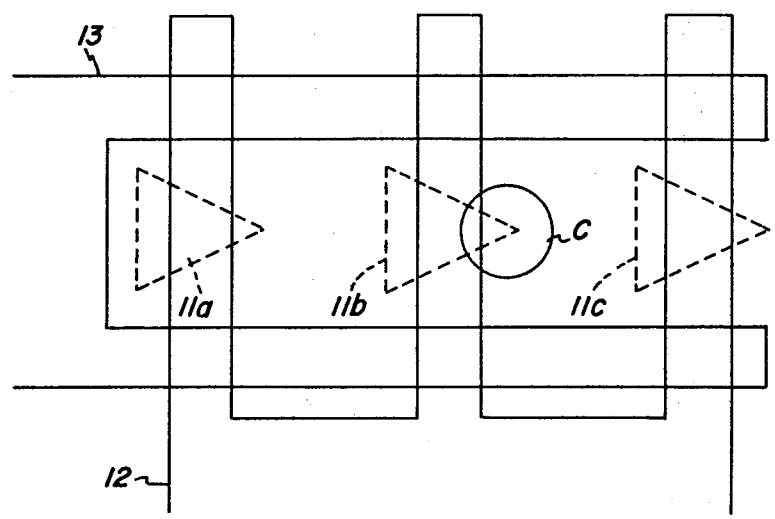

In FIGS. 4, 5, and 6, a fundamental principle of this invention is illustrated schematically.

FIG. 4 specifically indicates a state wherein a magnetic bubble C lies directly under the apex portion A of wedge-formed pattern 11A. Fo ease of understanding, it is assumed that the N-pole of the magnetic bubble C is in the plane of paper. That is, the magnetic field bias $H_B$ is directed downwards toward the surface of the paper as shown.

In FIG. 5, there is shown a state of magnetization of the magnetic bubble C when electric currents $I_1$ and $I_2$ flow through the conductor patterns 12 and 13, respectively, in the arrow-marked directions. Magnetic fields by these currents are formed in three regions formed by the superposition of the two conductor patterns 12 and 13, i.e. a region 17 defined by wider pitch portions $P_1$ of the two conductor patterns, another region 18 defined by the superposition of a wider pitch portion $P_1$ and a narrow pitch pattern $P_2$, and another region 19 defined by the superposition of narrower pitch portions $P_2$ of the two conductor patterns 12 and 13.

When the magnitude of the electric currents flowing through the two conductor patterns 12 and 13 are equal to each other, a magnetic field of a direction opposing to that of the bias magnetic field is created in the region 17, another magnetic field of a direction equal to that of the bias magnetic field is created in the region 18 because the magnetic field in a narrower pitch portion $P_2$ is stronger than that created in a wider pitch portion $P_1$ of the conductor patterns 12 and 13, and still another magnetic field of a direction equal to that of the bias magnetic field is created in the region 19.

Because of these magnetic fields, the magnetic bubble C as shown in FIG. 5 is subjected to a contracting force in the region 18 and forced into the region 17 wherein the bubble is subjected to an expansive force. At this time the electric currents flowing through the conductor patterns 12 and 13 are kept to sufficient values for causing the magnetic bubble C to intrude just under the subsequent wedge-formed pattern 11B. After the magnetic bubble C has been expanded and shifted just under the wedge-formed pattern 11B, the electric currents flowing through the conductor patterns 12 and 13 are interrupted and the magnetic bubble C is shifted to the position indicated in FIG. 6. It is to be noted that the magnetic bubble C is visible (using a magnetic-optical effect) to an observer looking on the element (direction of arrows $a$ and $b$ in FIGS. 2 and 3) for almost all of the time that it takes bubble C to move in the sequence shown in FIGS. 4–6 which makes bubble element construction of the present invention ideally suitable for image forming elements.

Figure 7:
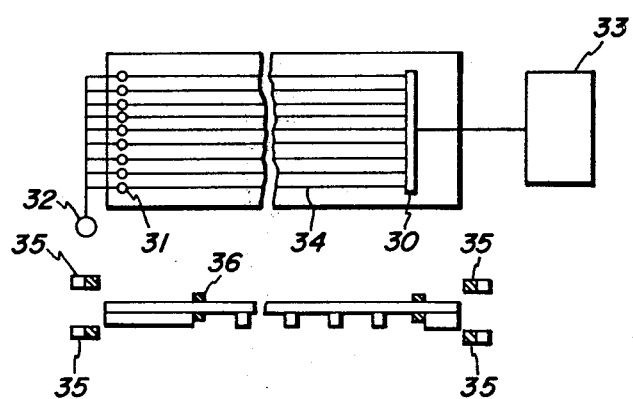
FIG. 7 shows in a simplified representation of a printer in which the magnetic bubble element of the present invention may be utilized.

FIG. 7 shows a simplified representation of a printer utilizing the magnetic bubble elements according to this invention each element having a bubble transferring mechanism as described hereinabove. In this figure, numeral 30 designates a conductor pattern terminal, 31 a magnetic bubble generator array, 32 a character generator, 33 a control circuit, 34 bubble transferring channels, 35 bias magnetic field generating coils, and numeral 36 deisgnates bubble erasing coils.

In the examples of the printer, the magnetic bubble generating array 31 successively generates magnetic bubbles in accordance with the data concerning a character, figure, or else delivered from the character generator 32 based on a signal from a computer or the like, and the magnetic bubbles are transferred by means of the conductor patterns 12 and 13 (not shown in FIG. 7) which are connected with the control circuit 33 and supplied therefrom with pulse currents. After the character, figure, or else has been converted into a magnetic bubble pattern as described above, the bubbles are expanded as shown in FIG. 5 and the bubbles thus expanded are visualized utilizing a magneto-optical effect. Since the substantial part of the wedge-formed pattern 11 overlies the region 18 formed by the superposition of the narrower pitch portion $P_2$ and the wider pitch portion $P_1$ and the apex portion A and the bottom portion B thereof (FIG. 5) intrude into the region 17 formed by the superposition of the wider pitch portion $P_1$ of the two conductor patterns, the wedge-formed patterns 11, which are opaque, cause no obstacle in optically visualizing the thus expanded magnetic bubbles utilizing a magneto-optical effect (such as Faraday effect). It should be noted that if orthoferrites are used as film 16, they are sufficiently transparent in red light to enable direct visual observation of bubble behavior by means of the Faraday effect. The character of figure displayed by the expanded magnetic bubbles are then developed by electronic photography, for example. After development, the magnetic bubble pattern is erased by interrupting the electric currents flowing through the conductor patterns 12 and 13 and moving the printer through the erasing coils 36.

The magnetic bubble element according to this invention can improve the high frequency driving feature in comparison with the conventional bias magnetic field modulating method, and furthermore, the difficulty caused by the requirement of providing a distance in a range of from 3 D to 4 D between each magnetic bubbles for avoiding the repulsive force caused between the magnetic bubbles can be eliminated by expanding the magnetic bubbles. For the latter reason, the ratio between the diameter of the image elements and the distance between the same elements can be substantially improved.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teaching of the present invention without departing from its essential teachings.

What is claimed is:

1. A magnetic bubble element comprising:
   a plurality of wedge-formed patterns having apex and bottom portions formed of a magnetic thin film material on a surface of a material which is capable of supporting magnetic bubbles therein, and
   a conductor grating associated with said supporting material comprising first and second undulating conductor patterns, each cycle of the undulation in said first and second conductor patterns defining a wider pitch and a narrower pitch, the superposition of a substantial portion of each of the wedge-formed patterns being disposed over a corresponding part of the first conductor pattern which defines the narrower pitch in a manner such that the apex portion and the bottom portion of each wedge shaped pattern extends into the portions of said second conductor which forms the wider pitch and the superposition of the apex portion and the bottom portion of each wedge shaped pattern extending into the portion of said first conductor which forms the wider pitch.

2. The magnetic bubble element as defined in claim 1 wherein the wedge-formed patterns and said first and second conductor patterns are formed on one surface of the bubbles supporting material.

3. The magnetic bubble element as defined in claim 1 wherein said first conductor pattern is formed on one surface of the bubble supporting element and said second conductor pattern and said wedge-formed patterns are formed on be other surface of the bubble supporting element.

4. The magnetic bubble element of claim 1 further including bias means for forming bubbles in said bubble supporting element.

5. The magnetic bubble element of claim 4 further including means for applying pulsating currents to said first and second conductor patterns of a magnitude sufficient to cause the formed bubbles to move in a predetermined direction.

6. The magnetic bubble element as defined in claim 5 wherein the magnetic bubbles are expanded in size as they move in said predetermind direction; said expanded bubbles being made visible by utilizing a magneto-optical effect.

7. The magnetic bubble element as defined in claim 6 wherein a plurality of said bubble forming elements are formed in a printer array wherein characters, figures or the like are formed by the expanded bubbles and optically visualized by utilizing a magneto-optical effect.

8. The magentic bubble element as described in claim 1 wherein the superposition of said first and second conductor patterns are such that when currents are applied thereto magnetic fields are formed in a first region defined by the wider pitch portions of said first and second conductor patterns, a second region defined by the superposition of the wider pitch portion of said second conductor pattern and said narrower pitch portion of said first conductor pattern and a third region defined by the superposition of the narrower pitch portions of said first and second conductor patterns.

9. The bubble element as defined in claim 8 wherein the magnitude of the currents flowing through said first and second conductor patterns are equal to each other whereby the magnetic field in said first region is of a first direction, the direction of the magnetic field in said second region is opposite to that in said first region and the direction of said magnetic field in said third region is opposite to that in said first region whereby a magnetic bubble formed in said thin film material under the apex portion of a first wedge shaped pattern is subjected to a contracting force in said second region and forced into said first region wherein it is subjected to an expansive force and shifted just under the wedge shaped pattern adjacent said first wedge shaped pattern, interruption of said current causing said magnetic bubble to be shifted under the apex portion of said adjacent wedge shaped pattern.

* * * * *